(12) United States Patent
Pinto (10) Patent No.: US 11,379,374 B2
(45) Date of Patent: Jul. 5, 2022

(54) SYSTEMS AND METHODS FOR STREAMING STORAGE DEVICE CONTENT

(71) Applicant: Samsung Electronics Co., Ltd., Suwon-si (KR)

(72) Inventor: Oscar P. Pinto, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 187 days.

(21) Appl. No.: 16/788,174

(22) Filed: Feb. 11, 2020

(65) Prior Publication Data

US 2020/0257629 A1 Aug. 13, 2020

Related U.S. Application Data

(60) Provisional application No. 62/804,747, filed on Feb. 12, 2019.

(51) Int. Cl.
*G06F 12/0868* (2016.01)
*G06F 30/331* (2020.01)
*G06F 9/30* (2018.01)
*G06F 12/02* (2006.01)

(52) U.S. Cl.
CPC ...... *G06F 12/0868* (2013.01); *G06F 9/30145* (2013.01); *G06F 12/0246* (2013.01); *G06F 30/331* (2020.01)

(58) Field of Classification Search
CPC ............... G06F 12/0868; G06F 30/331; G06F 9/30145; G06F 12/0246
See application file for complete search history.

(56) References Cited

U.S. PATENT DOCUMENTS

| 8,949,486 B1 | 2/2015 | Kagan et al. |
| 9,483,431 B2 | 11/2016 | Bergsten et al. |
| 9,582,432 B2 | 2/2017 | Topp et al. |
| 10,049,035 B1 | 8/2018 | Kulkarni et al. |

(Continued)

FOREIGN PATENT DOCUMENTS

| KR | 10-2012-0022065 A | 3/2012 |
| WO | 2016118615 A1 | 7/2016 |

OTHER PUBLICATIONS

International Search Report and Written Opinion of the International Searching Authority of corresponding PCT/IB2020/000206, dated Aug. 20, 2020, 13 pages.

*Primary Examiner* — Tammara R Peyton
(74) *Attorney, Agent, or Firm* — Lewis Roca Rothgerber Christie LLP (57) ABSTRACT

A method of streaming between a storage device and a secondary device includes receiving, by the storage device, from the secondary device, a memory read request command including a memory address of the storage device corresponding to a stream identity, the stream identity being unique between the storage device and the secondary device; streaming, by the storage device, data between the storage device and the secondary device by transferring the data corresponding to the memory address of the storage device to the secondary device; determining, by the storage device, that the data requested by the secondary device in the memory read request command is transferred to the secondary device; and ending, by the storage device, the streaming between the storage device and the secondary device.

21 Claims, 7 Drawing Sheets

(56) References Cited

U.S. PATENT DOCUMENTS

| | | | |
|---|---|---|---|
| 10,248,610 | B2 | 4/2019 | Menachem et al. |
| 2006/0161696 | A1 | 7/2006 | Anjo et al. |
| 2007/0002871 | A1* | 1/2007 | Pekonen .......... H04N 21/41407 |
| | | | 370/395.42 |
| 2008/0068993 | A1 | 3/2008 | Roos et al. |
| 2009/0028186 | A1 | 1/2009 | Schmidt et al. |
| 2010/0153661 | A1 | 6/2010 | Vamanan et al. |
| 2012/0054420 | A1 | 3/2012 | Kang et al. |
| 2013/0145051 | A1 | 6/2013 | Kegel et al. |
| 2013/0305276 | A1* | 11/2013 | Barhate .............. H04N 21/6125 |
| | | | 725/32 |
| 2018/0174268 | A1 | 6/2018 | Bittner et al. |

\* cited by examiner

SYSTEMS AND METHODS FOR STREAMING STORAGE DEVICE CONTENT

CROSS-REFERENCE TO RELATED APPLICATION(S)

The present application claims priority to and the benefit of U.S. Provisional Patent Application Ser. No. 62/804,747, filed Feb. 12, 2019, entitled "SMART SSD," the entire content of which is incorporated herein by reference.

FIELD

One or more aspects of embodiments according to the present disclosure relate to network-attached devices, more particularly, to a system and method for streaming storage device content.

BACKGROUND

Non-volatile memory (NVM) express (NVMe) is a standard that defines a memory-mapped register-level interface for host software to communicate with a non-volatile memory subsystem (e.g., a solid state drive (SSD)) over a peripheral component interconnect express (PCIe) bus. NVMe is an alternative to the Small Computer System Interface (SCSI) standard for connecting and transferring data between a host and a peripheral target storage device or system. PCIe-connected NVMe SSDs allow applications to communicate directly to storage. For data that is not sequential to be exchanged with a secondary device, the data layout details and filesystems may be involved for consumption by the secondary device. This adds complexity and security issues since it requires exposing the data layout details. A simpler interface is desired that circumvents such complex requirements.

The above information disclosed in this Background section is only for enhancement of understanding of the background of the invention and therefore it may contain information that does not constitute prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of example embodiments of the present disclosure relate to a system and method for streaming storage device content.

In some embodiments, a method of streaming between a storage device and a secondary device includes receiving, by the storage device, from the secondary device, a memory read request command including a memory address of the storage device corresponding to a stream identity, the stream identity being unique between the storage device and the secondary device; streaming, by the storage device, data between the storage device and the secondary device by transferring the data corresponding to the memory address of the storage device to the secondary device; determining, by the storage device, that the data requested by the secondary device in the memory read request command is transferred to the secondary device; and ending, by the storage device, the streaming between the storage device and the secondary device.

In some embodiments, the storage device is a solid state drive (SSD) and the secondary device is a field programmable gate array (FPGA). In some embodiments, the SSD and the FPGA are located on the same bus. In some embodiments, the SSD and the FPGA are co-located in a computational storage drive. In some embodiments, the streaming between the storage device and the secondary device further includes streaming, by the storage device to the secondary device, data stored in a stream buffer of the storage device, wherein the secondary device is an embedded processor or a network interface controller (NIC), the embedded processor being an Advanced RISC Machine (ARM)) processor or a RISC-V processor. In some embodiments, the data stored in the stream buffer being the data in the memory address of the storage device corresponding to the stream identity. In some embodiments, the storage device filling the stream buffer until the data requested by the secondary device in the memory read request command is streamed to the secondary device from the storage device.

In some embodiments, the method further includes receiving, by the storage device, a command from a host device connected to the storage device, to reserve the stream identity for a data stream for the streaming of data between the storage device and the secondary device; sending, by the storage device, the stream identity to the host device; and registering, by the host device, in response to receiving the stream identity from the storage device, the stream identity with the secondary device connected to the host device and the storage device. In some embodiments, the method further includes receiving, by the storage device, a read stream request command from the host device; and receiving, by the secondary device, from the host device, a request command to start streaming between the storage device and the secondary device.

In some embodiments, the read stream request command from the host device including the stream identity, a logical block address (LBA) offset, and number of blocks to read by the secondary device from the storage device. In some embodiments, in response to receiving the read stream request command, a controller in the storage device is configured to place data in a stream buffer of the storage device, wherein the data placed in the stream buffer includes the data requested by the read stream request command. In some embodiments, the method further includes sending, by the storage device to the host device, an acknowledgement that the read stream request command from the host device is completed by the storage device; and sending, by the secondary device to the host device, an acknowledgement that the request command to start streaming between the storage device and the secondary device from the host device is completed by the secondary device.

In some embodiments, a method includes receiving, by a secondary device, from a host device connected to the secondary device, a request command to start streaming between a storage device and the secondary device, the storage device being connected to the secondary device and the host device; sending, by a secondary device to the storage device, a memory read request command including a memory address of the storage device corresponding to a stream identity, the stream identity being unique between the storage device and the secondary device; and receiving, by the secondary device from the storage device, via streaming, data corresponding to the memory address of the storage device to the secondary device, wherein in response to the data requested by the secondary device in the memory read request command being transferred to the secondary device, the storage device is configured to end the streaming between the secondary device and the storage device.

In some embodiments, the storage device is a solid state drive (SSD) and the secondary device is a field programmable gate array (FPGA), the SSD and the FPGA being located on the same bus or being co-located in a computational storage drive. In some embodiments, the streaming further includes, receiving, by the secondary device from the storage device, data stored in a stream buffer of the storage device, the data stored in the stream buffer being the data in the memory address of the storage device corresponding to the stream identity, wherein the storage device is configured to fill the stream buffer until the data requested by the secondary device in the memory read request command is streamed to the secondary device from the storage device. In some embodiments, the method further includes registering, at the secondary device by the host device, the stream identity received from the storage device; and sending, by the secondary device to the host device, an acknowledgement that the request command to start streaming between the storage device and the secondary device from the host device is completed by the secondary device.

In some embodiments, a method of streaming between a storage device and a secondary device includes receiving, by the storage device, a command from a host device connected to the storage device, to reserve a stream identity for a data stream for the streaming of data between the storage device and the secondary device; registering, by the host device, in response to receiving the stream identity from the storage device, the stream identity with the secondary device connected to the host device and the storage device; receiving, by the storage device, a read stream request command from the host device; receiving, by the secondary device, from the host device, a request command to start streaming between the storage device and the secondary device; receiving, by the storage device, from the secondary device, a memory read request command including a memory address of the storage device corresponding to the stream identity; and streaming, by the storage device, data between the storage device and the secondary device, by transferring the data corresponding to the memory address of the storage device to the secondary device.

In some embodiments, the method further includes determining, by the storage device, that the data requested by the secondary device in the memory read request command is transferred to the secondary device; ending, by the storage device, the streaming between the storage device and the secondary device; sending, by the storage device to the host device, an acknowledgement that the read stream request command from the host device is completed by the storage device; and sending, by the secondary device to the host device, an acknowledgement that the request command to start streaming between the storage device and the secondary device from the host device is completed by the secondary device. In some embodiments, the storage device is a solid state drive (SSD) and the secondary device is a field programmable gate array (FPGA), the SSD and the FPGA being located on the same bus or being co-located in a computational storage drive. In some embodiments, the read stream request command from the host device including the stream identity, a logical block address (LBA) offset, and number of blocks to read by the secondary device from the storage device, wherein in response to receiving the read stream request command, a controller in the storage device is configured to place data in a stream buffer of the storage device, wherein the data placed in the stream buffer includes the data requested by the read stream request command, and wherein the stream identity is unique between the storage device and the secondary device.

In some embodiments, a system includes a storage device; a secondary device connected to the storage device; and a host device connected to the storage device and the secondary device, wherein: the storage device is configured to receive a command from the host device to reserve a stream identity for a data stream for streaming of data between the storage device and the secondary device; the host device is configured to register the stream identity with the secondary device; the storage device is further configured to receive a read stream request command from the host device; the secondary device is configured to receive a request command to start streaming between the storage device and the secondary device from the host device, in response to the secondary device receiving the request command to start streaming between the storage device and the secondary device from the host device, the storage device is configured to: receive a memory read request command including a memory address of the storage device corresponding to the stream identity from the secondary device; and stream data between the storage device and the secondary device by transferring the data corresponding to the memory address of the storage device to the secondary device.

BRIEF DESCRIPTION OF THE DRAWINGS

These and other features of some example embodiments of the present disclosure will be appreciated and understood with reference to the specification, claims, and appended drawings, wherein:

DETAILED DESCRIPTION

The detailed description set forth below in connection with the appended drawings is intended as a description of some example embodiments of a system and method for streaming storage device content provided in accordance with the present disclosure and is not intended to represent the only forms in which the example embodiments of the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

In some cases, the disclosed embodiments can be used in connection with a NVMe standard. In particular, NVMe can refer to a standard that defines a register-level interface for a host software to communicate with a non-volatile memory subsystem (e.g., an SSD) over a Peripheral Component Interconnect (PCI) Express (PCIe) bus. NVMe can represent an alternative to the Small Computer System Interface (SCSI) standard for connecting and transferring data between a host and a peripheral target storage device or system. PCIe-connected NVMe SSDs allow applications to talk directly to storage. It is to be understood that the disclosed systems can be used with other standards that are similar, but not necessarily identical to, NVMe, PCI, PCIe, and/or SCSI.

The physical connection of the NVMe may be based on a PCIe bus. A typical Ethernet SSD (eSSD) may have a U.2 connector to interface with a system via a mid-plane over the PCIe bus. In some examples, U.2 (small form factor (SFF)-8639) can refer to a computer interface for connecting SSDs to a computer. A U.2 connector can support one Serial Advanced Technology Attachment (SATA) port, two Serial Attached SCSI (SAS) ports or up to four lanes (X4) of parallel I/O in PCIe SSDs. The U.2 connector is standardized for NVMe and supports PCIe 3.0 X4, providing five times the speed of some SATA SSD. It is to be understood that the disclosed systems can be used with other form factors and standardized interfaces that are similar, but not necessarily identical to, U.2, SATA, SAS, PCIe 3.0, and/or the like.

NVMe and/or NVMe over fabric (NVMe-oF) SSDs may offer relatively higher speed compared to some devices. For example, in the NVMe-oF mode of operation, the storage device may be able to operate with different Ethernet speeds from about 10 Gigabits per second (Gbps) up to about 100 Gbps or higher, without significant changes to the storage device's hardware). With multiple device input output (IO) queues, the NVMe SSDs (and/or NVMe-oF SSDs) may offer greater parallelism compared to some devices. Peripheral Component Interconnect Express (PCIe) generation 3 (Gen3), X4, and X8 devices may saturate the PCIe bandwidth limits and may limit device scaling. As such, even though the NVMe and/or NVMe-oF SSDs may offer better performance compared to some devices, NVMe and/or NVMe-oF SSDs may not be tapped into when multiple of PCIe Gen3, X4, and X8 devices are utilized in a server due to certain system design features. Scaling with PCIe Gen4 may also show similar results in part because the NVMe and/or NVMe-oF SSDs may offer better performance compared to some devices and may saturate the PCIe bandwidth limits per device. It is to be understood that the disclosed systems can be used with other standards that are similar, but not necessarily identical to, NVMe-oF, PCIe Gen3, Gen4, Gen8, and/or the like.

Certain computing devices may be slower than the NVMe and/or NVMe-oF SSDs (e.g., for certain workloads). In some cases, interconnect speeds may also be slower than the speeds of the computing devices and the storage devices (e.g., NVMe and/or NVMe-oF SSDs). Further, certain interfaces may not be able to scale for dense deployment usages. Moreover, performing computation using data stored near the computing device may cause various challenges depending on types of the computing device (e.g., field programmable gate array (FPGA), graphics processing unit (GPU), embedded central processing unit (CPU), and dedicated application-specific integrated circuits (ASICs)). It may be desirable to scale SSD response to compute without slowing down other requests.

The ability of a secondary device to directly process data from an SSD with read IO or directly write to it may not be available in some devices without the intervention of the host. Therefore, it may be desirable to provide a mechanism to directly stream between a solid state drive (SSD) to a secondary device (e.g., field programmable gate array (FPGA)) with minimal host interaction, e.g., direct peer-to-peer stream. It may also be desirable to provide a mechanism to discover and configure. It may further be desirable to not affect regular input outputs (IOs) with host for performance and latencies.

A computational storage drive (e.g., an FPGA based SSD device) may enhance storage usages with the near-storage acceleration feature available in such a device. In some cases, direct streaming between an SSD and a secondary device (e.g., a FPGA) may not be available in some devices. For example, the ability of a secondary device (for example, FPGA in a computational storage drive) to directly process data from an SSD (e.g., SSD in the computational storage drive) with read IO or directly write to the SSD may not be available in some devices without the intervention of the host, because in some devices IO stacks are developed with the host CPU and related software being the main orchestrator of the data movement between the secondary device and the storage device. In some embodiments, the form factor of the computational storage drive may be U.2. In some other embodiments, the form factor of the computational storage drive may be an add-in-card (PCIe). In some embodiments, the computational storage drive may have Enterprise and Datacenter Small Form Factor (EDSFF) family of standards. It is to be understood that the disclosed systems can be used with other standards that are similar, but not necessarily identical to, U.2, PCIe, EDSFF, and/or the like.

In some embodiments, streaming may refer to a method of transmitting or receiving data (e.g., video and audio data) over a computer network as a steady, continuous flow, allowing the received portion of the data to be processed by the receiving device while the rest of the data is still being received by the receiving device. In some embodiments, streaming of data includes structured and unstructured data. This may be database files, video, audio and other packet based entities. The streaming receiver may need to understand the data format as the consumer of the data. Similarly, the data generator may need to understand the stream format as the producer of the data.

In some other cases, during streaming operations between an SSD and a secondary device (e.g., a FPGA) of some device, an internal configuration of the SSD may be disclosed to the secondary device, which may not be desirable for security concerns with respect to the SSD. For example, in some devices, during direct streaming, the filesystem knowledge of the SSD device may be exposed to the secondary device, which may put the security of the SSD in a vulnerable position. For example, a file system and a block subsystem abstractions in the data stored in the SSD that may be adhered through specific storage protocols to read and write data directly from another device. Security may be another factor that is considered in direct and virtualized environments that limit direct data movement or peer-to-peer data movement.

For streaming between an SSD and a secondary device in certain devices, a host device connected to the computational storage drive may manage the data flow (e.g., submissions, completions, interrupts, buffers) between the SSD and the secondary device (e.g., a FPGA).

Figure 1:
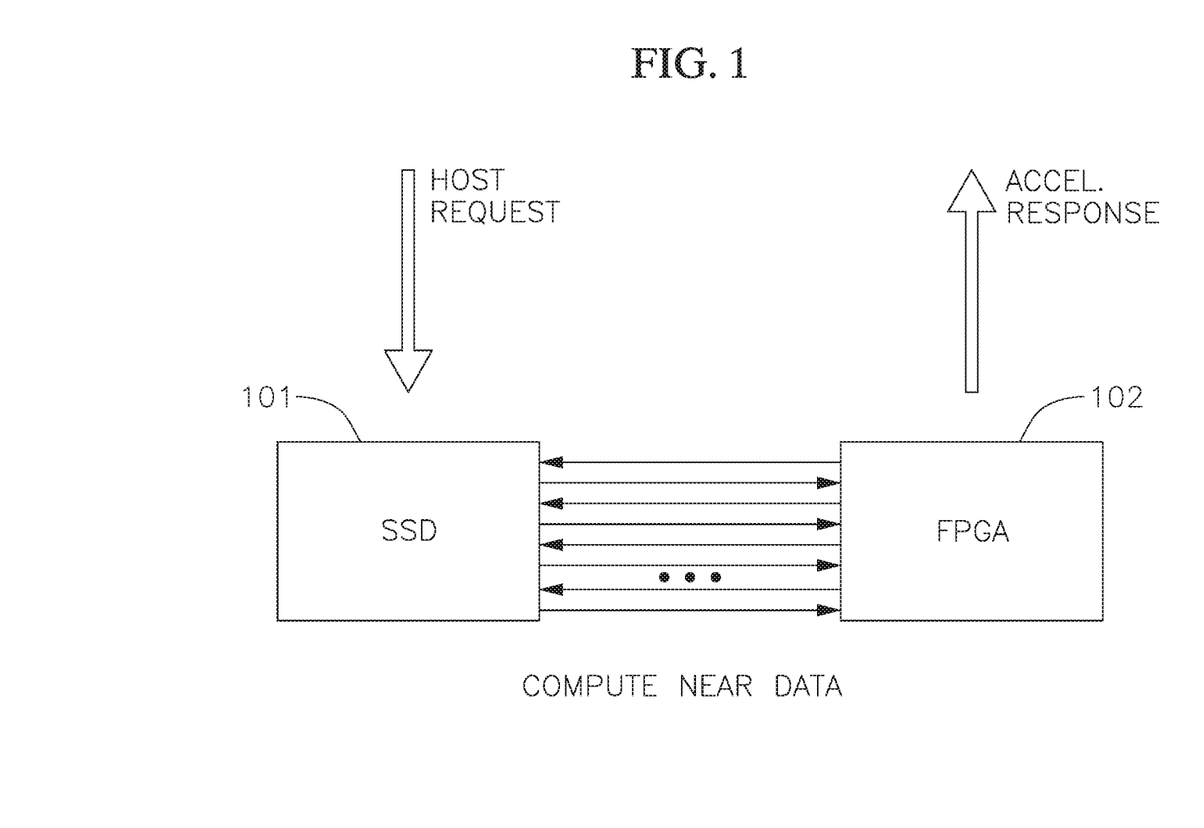
FIG. 1 illustrates data communication between a storage device and a secondary computing device.

FIG. 1 illustrates data communication between a storage device (e.g., SSD) and a secondary computing device (e.g., FPGA). In FIG. 1, the SSD 101 and the FPGA 102 may be co-located in a computational storage drive (e.g., FPGA embedded SSD), or located nearby, e.g., on the same bus. The FPGA 102 may receive data stored in the SSD 101 and may perform computation using the data received from the SSD 101. The data movement, for example, the streaming of data between the FPGA 102 and the SSD 101 may be managed by a host device connected to the SSD 101 and the FPGA 102.

In case of streaming between an SSD (e.g. SSD 101) and a secondary device (e.g., FPGA 102), a host device connected to the computational storage drive (e.g., an SSD embedded with an FPGA) may manage the data flow (e.g., submissions, completions, interrupts, buffers) between the SSD (e.g., SSD 101) and the secondary device (e.g., a FPGA 102). When the data movement between the SSD and the secondary device is managed by the host CPU, considerable amount of CPU processing power may be needed to manage IO, the host dynamic random-access memory (DRAM) may be used for data staging and copy operations, and resources (e.g., submission queue (SQ), completion queue (CQ), interrupts) may be consumed. Also, when a host device is used to manage the data flow between the SSD (e.g., SSD 101) and the secondary device (e.g., FPGA 102), computation offload may require the host CPU intervention, for example, data movement orchestration even when no data is consumed.

Moreover, the data movement between the SSD (e.g., SSD 101) and the secondary device (e.g., FPGA 102) being managed by the host CPU may introduce performance limitations & latencies, for example, host side processing may introduce latencies on normal IOs. In some cases, the host CPU managing the data movement between the SSD (e.g., SSD 101) and the secondary device (e.g., FPGA 102) may expose the filesystem or the block subsystem of the SSD (e.g., SSD 101) and other SSD resources, for example, file system metadata and/or NVMe queues.

Without the ability for a secondary device (e.g., FPGA 102) to have direct read write capability to a storage device (e.g., SSD 101) when they are co-located (e.g., a computational storage drive) or located nearby, e.g., on the same bus, near data processing may be limiting. For example, some computational storage drives do not offer direct streaming features to stream directly from a storage device (e.g., SSD) to a secondary device (e.g., FPGA).

Some computational storage drives may have the ability to provide near-storage acceleration. Streaming can serve as a means of providing data access from an SSD to an accelerator device or any other device without the complexity of data layout and protocol. Further, streaming may enable many use cases with computational storage drive and broadly across different types of storage devices (e.g., SSDs).

Computational storage drives and similar peer-to-peer (P2P) devices may benefit from having direct streaming features to stream directly from a storage device (e.g., SSD) to a secondary device (e.g., FPGA). The capability of the SSD (e.g., SSD in the computational storage drive) to stream directly to a secondary device (e.g., FPGA in the computational storage drive) may enhance data processing efficiency of the computational storage drives.

Therefore, in computational storage drives (e.g., FPGA based SSD or an FPGA integrated into an SSD to provide near storage processing) streaming feature with minimized host CPU mitigation may be desirable. For example, computational storage drives having streaming as means of data access from an SSD to an accelerator device or one or more other devices without the complexity of data layout and protocol may increase the usages of the computational storage drives (e.g., FPGA based SSD devices) and/or other types of storage devices. For example, having a direct streaming feature between the SSD and the secondary device of the computational storage drive may enable the SSD and the secondary device of the computational storage drive to transfer data without the intervention of the host CPU and the host DRAM. NVMe describes a stream directive for writing data in a device that helps the controller of the device to associate data of a group. The controller may use the stream input to write the associated incoming data together. In this regard, the controller can allocate one or more buffers to hold write data in its internal memory until it is ready to write to flash. Accordingly, data that is associated together in flash can be placed because data movement during wear leveling and garbage collection may occur on this data together because the data's grouping has been already established with the multi-stream directive.

One or more example embodiments according to the present disclosure may be applied to a computational storage drive (e.g., an advance computational storage drive) and its variants. Some embodiments of the present disclosure may scale with dual usage, for example, an SSD may be used for regular IO (input/output) as well as streaming and does not expose device layout and details like logical block accessing (LBA), blocks, objects, key-value, filesystem metadata to end device (e.g., FPGA). Some embodiments of the present disclosure may apply to Non-Volatile Memory Express (NVMe) SSDs and may be applied for external devices that have direct access to SSD, e.g., FPGA to SSD, ARM to SSD, graphics processing unit (GPU) to SSD, network interface controller (NIC) to SSD. Some embodiments of the present disclosure may provide a mechanism for an SSD to stream to a sub device (multi-device) or a device on the same bus without host translations, a mechanism to discover and setup streaming, and a method to stream to/from device for PCIe devices while keeping data layout and translations private to host. One or more example embodiments according to the present disclosure may provide for an SSD to stream read or write transactions to secondary device on the same bus or co-located, a secondary device to fetch data when it is ready without host translations, a secondary device to fetch streaming data without slowing down primary device (SSD), and a mechanism to stream data without host application translations in the data path.

Figure 2A:
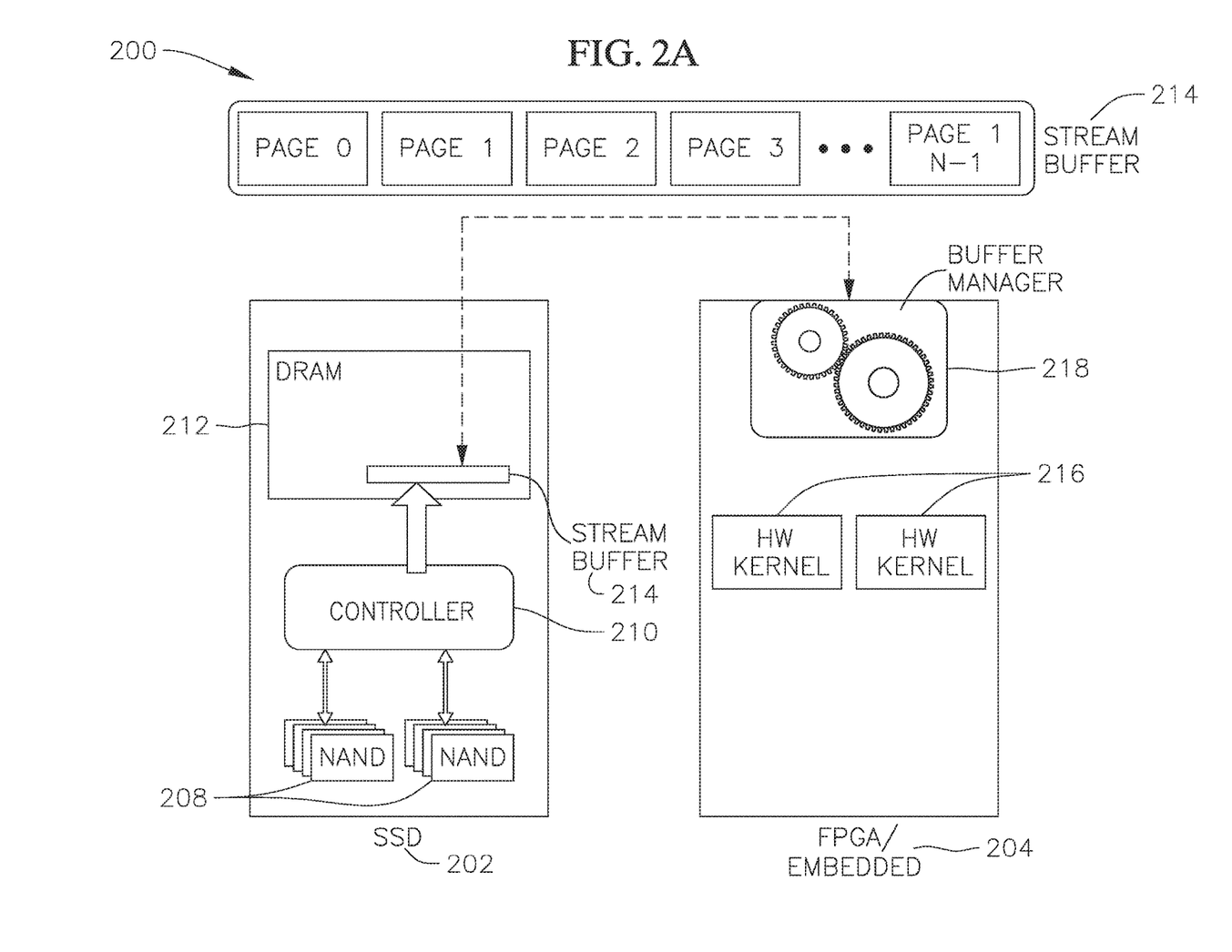
FIGS. 2A-2D illustrate a system and a method for direct read or write streaming between a storage device and a secondary device when the storage device and secondary device are co-located or located on a same bus.

In some embodiments, the reads may be satisfied back to the host request normally but held in the SSD's buffer. Such data (e.g., data held in SSD's buffer) may be requested by the FPGA when the FPGA is ready to perform computation. In some embodiments, holding data in the SSD buffer while satisfying a host's original request may not slow down the SSD. The held data in the SSD's buffer may be pulled in by the FPGA when the FPGA is ready to perform computation because the FPGA may be slower than the SSD. The SSD may maintain the right to reclaim the allocated stream buffer memory when resources are constrained. The stream buffer is similar to write stream buffer, except it holds the read request data. The size of the stream buffer 214 may be as supported by the device (e.g., SSD 202). In some embodiments, the size of the stream buffer may be about 3 megabyte (MB) or any other suitable size (e.g., tens or hundreds of MBs or gigabytes). There may be more than one simultaneous streams as the hardware supports.

FIGS. 2A-2D illustrate a system and a method for direct read or write streaming between a storage device (e.g., SSD) and a secondary device (e.g., FPGA) when they are co-located (e.g., a computational storage drive) or located nearby, e.g., on the same bus. The example embodiment of FIGS. 2A-2D illustrates how a secondary device (e.g., FPGA) streams data directly from a storage device (e.g., SSD) without host CPU interaction in the IO path.

The system 200 of FIG. 2A includes an SSD 202 and a FPGA 204 co-located in a computational storage drive or located nearby on the same bus and connected to a host device 206. The SSD 202 includes a plurality of Not AND (NAND) devices 208 connected to an SSD controller 210, which is further connected to one or more SSD DRAM devices 212. The SSD DRAM 212 includes a stream buffer 214. The stream buffer 214 may be similar to a write stream buffer, however, in some embodiments the stream buffer 214 holds the read request data from the FPGA 204. The size of the stream buffer 214 may be as supported by the SSD 202 (e.g., 3 MB). There may be more than one simultaneous streams from the stream buffer 214 as the hardware supports. In some embodiments, the controller 210 may execute software, NVMe commands, and/or firmware, stored, for example, in the buffer memory (e.g., stream buffer 214), or in read-only memory (e.g., DRAM 212) in the controller (or separate from the controller). The FPGA 204 can include a plurality of hardware (HW) kernels 216 and a buffer manager 218.

In some embodiments, the SSD 202 may conform to a predetermined form factor, for example, an approximately 2.5 inch hard drive form-factor (or small form factor (SFF)) standard. In other embodiments, the SSD 202 may conform to a standard PCIe card form factor, e.g., a full-height, full length (FH-FL) card outline, or a full-height, half length (FH-HL) outline. In some embodiments, the SSD 202 may be a new form factor 1 (NF1) SSD or an EDSFF SSD. In some cases, the NF1 SSDs may also be called NGSFF or M.3 based SSDs. However, in the example embodiments of the present disclosure, the SSD can use any similar form factors not listed here in the interest of brevity.

In some embodiments, in order to start direct streaming (e.g., read streaming) between the SSD 202 and the FPGA 204 co-located in a computational storage drive or located nearby on the same bus, the SSD 202 may expose a streaming (e.g., read/write streaming) capability to the FPGA 204. In some embodiments, the streaming capability of the SSD 202 may be discovered (e.g., by the FPGA 204) in a NVMe identify controller sub-field or any other suitable field. In some cases, this is also possible at the boot time to verify by the FPGA 204 on streaming capability of its co-device. For example, in some embodiments, the SSD 202 may be a NVMe SSD and may advertise the streaming capability through an identify controller feature option field or any other suitable field. Additionally, the controller (e.g., SSD controller 210) may provide read and write level functionality details on whether it is supported for both read and write operations, one of them, or none. The application may query the controller (e.g., SSD controller 210) capabilities and then proceed to configuration.

Figure 2B:
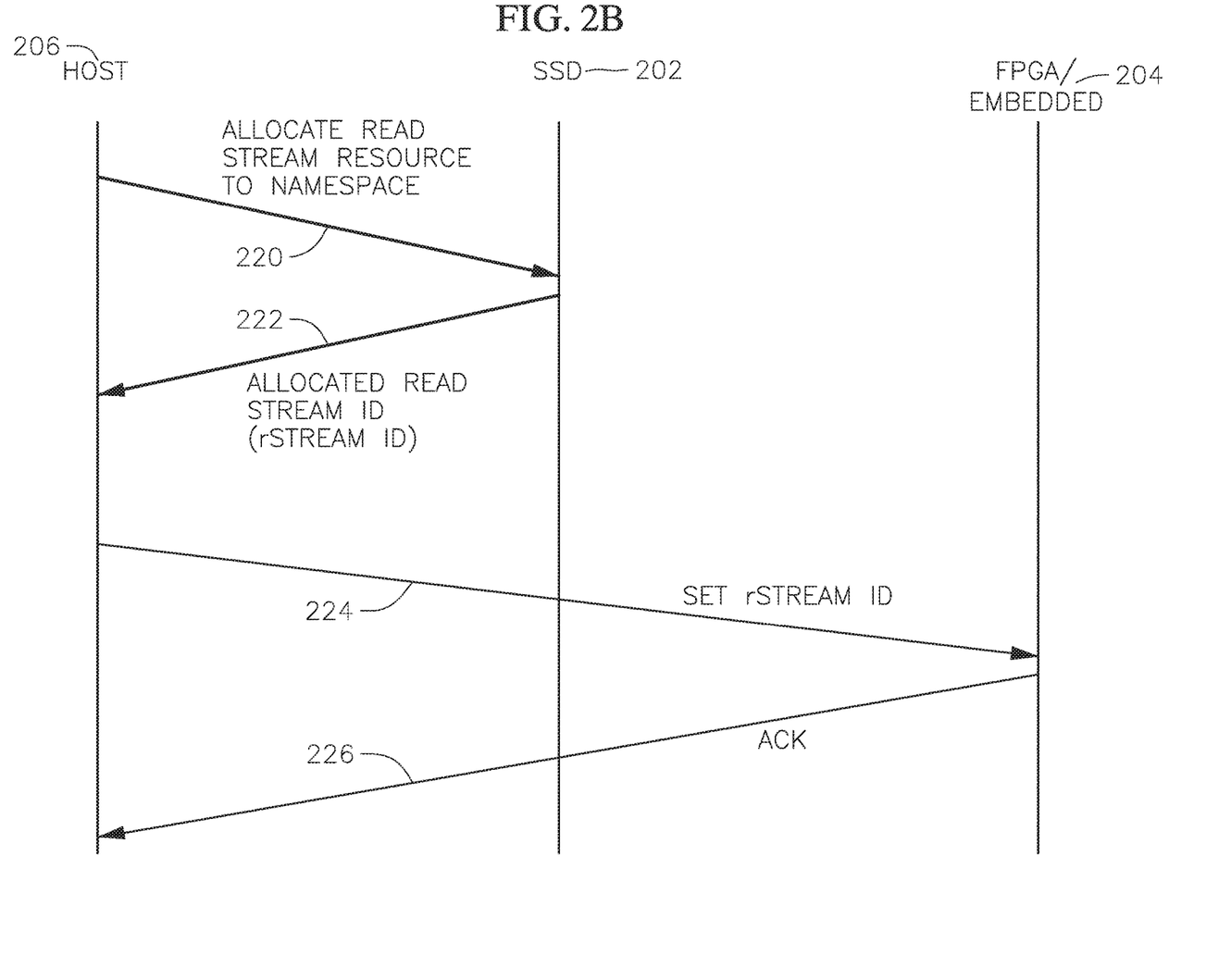

FIG. 2B illustrates configuration of a stream (e.g., read/write stream) between the SSD 202 and the FPGA 204. At 220 in response to the discovery of the SSD 202, the host device 206 can send a reserve stream_id command to the SSD 202 (e.g., SSD controller 210) with an NVMe command, may reserve a stream_id from the SSD 202 with an NVMe command, or may allocate a read stream resource to the namespace. The reservation request 220 from the host device 206 may contain additional details such as read/write request, service level agreement (SLA), and protection details, or the like.

A stream_id may be defined as a reservation to an SSD resource that provides the ability to read data out of or write data to an SSD (e.g., SSD 202) directly without host (e.g., host device 206) intervention. The stream_id is valid to start streaming only after it is configured by the host (e.g., host device 206), where the data resides. This is (e.g., stream_id) provided as a map of the data blocks (or key values) to stream sequentially from/to the SSD (e.g., SSD 202). This (e.g., stream_id) in return obscures the data layout (of the SSD 202) to the FPGA (e.g., FPGA 204) on where the data resides and hence provides the necessary security protections and filesystem knowledge requirements. The stream_id and the mechanisms described herein should not be confused with the multi-streaming concept for effective data placement and data lifetime implemented for effective garbage collection.

At 222, the SSD 202 responds to the host device 206 with a stream identity (stream_id) 203 token (or read stream_id) after checking additional attributes as supported. The stream_id 203 token can be made unique between the SSD 202 and the FPGA 204.

At 224, in response to receiving the unique stream_id 203 token from the SSD 202, the host device 206 registers the unique stream_id 203 token value received from SSD 202 with the FPGA 204 (or embedded CPU, GPU. ASIC). The FPGA 204 saves the unique stream_id 203 token value received from SSD 202 and may use it for future streaming requests.

In some embodiments, the host device 206 may register a data stream (or a data path along the data flow between the SSD 202 and the FPGA 204) based on the stream_id and reserve the resources required through the entire path taken by the stream (or reserve the bandwidth of the stream), based on the bandwidth requirement and the latency.

In some embodiments, the FPGA 204 may be programmed with the read stream_id 203 that the request was issued on, which may help the buffer manager 218 of the FPGA 204 to bind the stream request to the associated HW kernel 216.

At 226, the FPGA 204 sends acknowledgement of the unique stream_id 203 token value being saved in the FPGA 204 for future streaming request use, to the host device 206.

In some embodiments, the SSD 202 may internally allocate the SSD stream buffer 214 in the SSD DRAM 212 to hold read/write data stream (e.g., by the unique stream_id 203 token value).

Figure 2C:
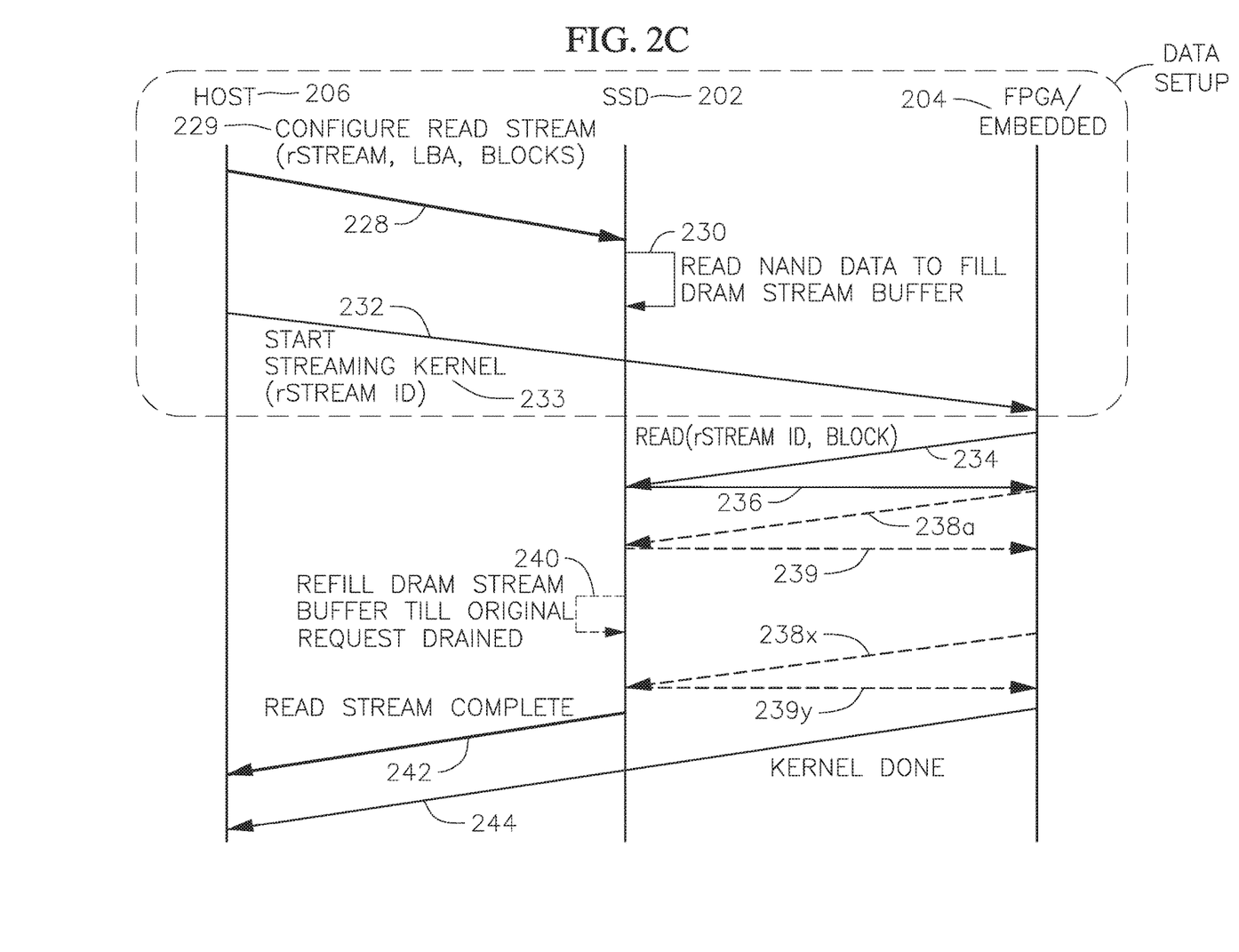
Figure 2D:
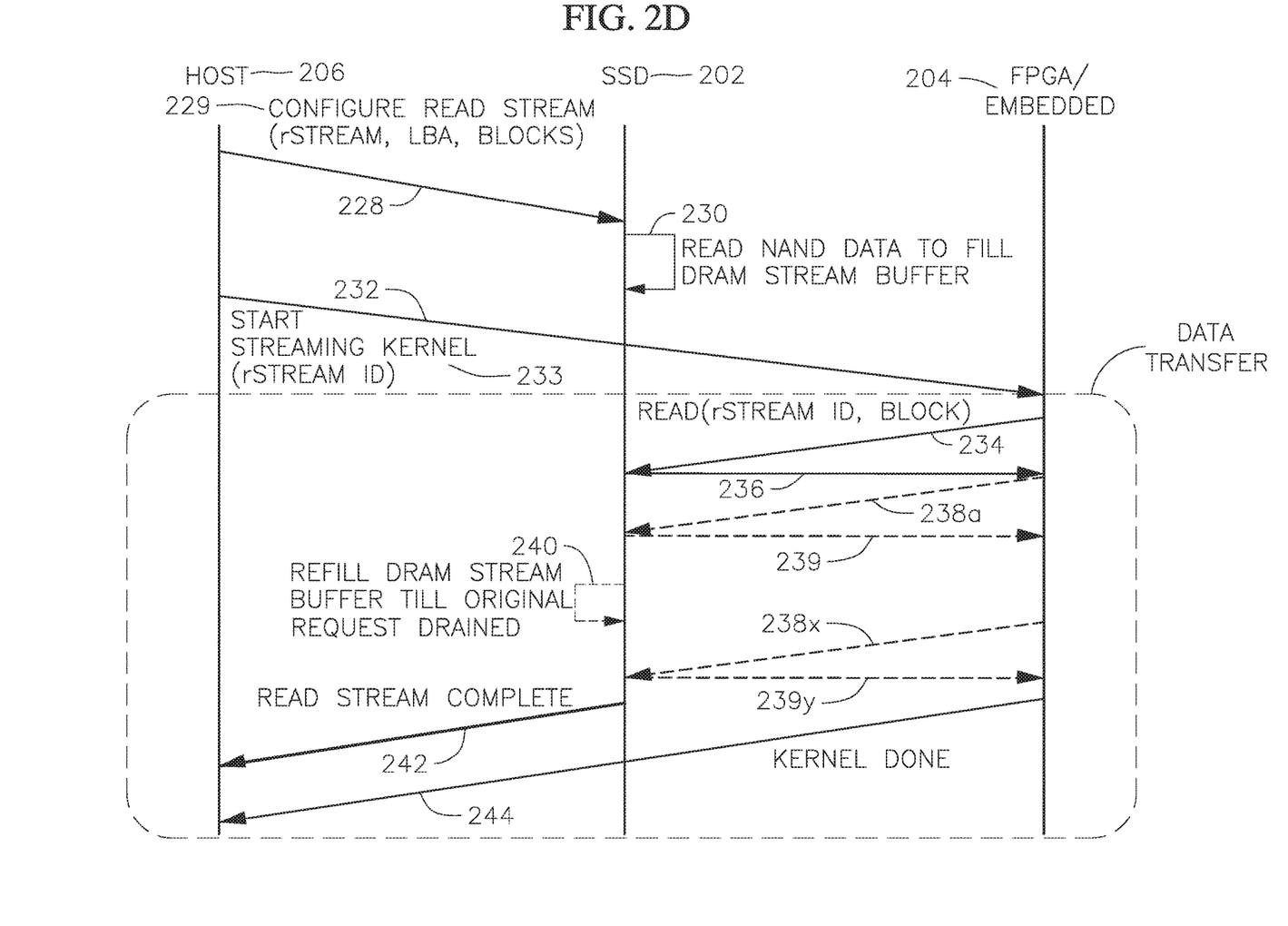

FIGS. 2C-2D illustrate data setup and data transfer between the SSD 202 and the FPGA 204 via streaming. Data transfer between the SSD 202 and the FPGA 204 using the streaming approach may be achieved after the FPGA 202 has been configured with the stream_id 203 token (e.g., as discussed with respect to 224 of FIG. 2B). In some embodiments, the host device 206 may still be responsible to initiate the actual streaming between the SSD 202 and the FPGA 204 (e.g., as discussed with respect to FIG. 2B) and hence may control aspects of data layout translations, file system specific metadata, security, combinations thereof, and/or the like.

To start streaming data transfers, the host can submit a configure read stream request to the SSD that contain the data specific layout details along with the stream_id 203. For example, as illustrated with respect to FIG. 2C, at 228, the host device 206 sends a configure stream command (e.g., read stream command) or a configure read stream request 229 to the SSD 202 with data layout specific details (LBA blocks, Object etc.). For example, the configure stream command or the configure read stream request 229, as shown in 228 of FIG. 2C, may contain the stream_id 203, LBA offset, and number of blocks to read. The configure stream command or the configure read stream request 229 may be able to support a relatively large request that may be described by a scatter gather lists (SGL)/physical region pages (PRP) list and may be a large file (e.g. 10 GB data file) or a set of files.

In some embodiments, at 230, in response to receiving the configure stream command or the configure read stream request 229 at 228, the SSD 202 may allocate a buffer (e.g., stream buffer 214 as shown in FIG. 2A) in its internal DRAM 212 to cache the read contents in that buffer (e.g., stream buffer 214). For example, in some embodiments, the configure stream command or the configure read stream request 229 received by the SSD 202 at 228 may be satisfied by the SSD controller 210 by placing the data (in the SSD kernel or NAND 208 corresponding to memory address corresponding to the stream_id) in the SSD stream buffer 214 or filling the circular stream buffer 214 with read data (or waits for write data) or requested stream contents. In some embodiments, the SSD 202 may acknowledge the configure request (e.g., the configure read stream request 229) back to the host device 206 as soon as it receives it (although not explicitly shown in FIG. 2C). In some other embodiments, it (e.g., the SSD 202) may wait till the request (e.g., the configure read stream request 229) is fully processed and all resources are allocated and setup with prefetched data if required.

The SSD 202 may not read all contains requested but only read a small amount of data to be able to satisfy the streaming request immediately when requested through the stream buffer (e.g., configure stream command or the configure read stream request 229). For example, the SSD 202 may allocate only a 3 MB buffer and fill it with the contents requested up to 3 MB. The refill of the SSD 202 stream buffer may be done independently of other block read/write requests from host to SSD and may not slow down either to satisfy the Buffer Manager's 218 requests from FPGA 204.

At 232, the host device 206 sends start streaming request 233 to the FPGA 204.

FIG. 2D illustrates a direct streaming between the SSD 202 and the FPGA 204. As illustrated in FIG. 2D, during data transfer between the SSD 101 and FPGA 204 by direct streaming, at 234, the FPGA 204 sends a read stream request or memory read request (e.g., a PCI transaction layer protocol (TLP) packet) to the SSD 202 with the memory address set to the unique token number stream_id 203 and length broken down by total required size by maximum packet length size.

At 236, the SSD 202 can satisfy the read stream request from the FPGA 204 by satisfying the FPGA 204 request with a read response from the stream buffer 214 of the SSD 202. In other words, at 236 the SSD starts the transfer of data stored in the stream buffer 214 of the SSD 202 to the FPGA 204. The data stored in the stream buffer 214 of the SSD 202 corresponds to the data requested in the memory address in 234 of the FPGA 204 corresponding to the stream_id 203.

At 240, the SSD 202 can backfill the stream buffer 214 until the original read stream request from the FPGA 204 is complete (e.g., until all the data requested by the FPGA 204 is transferred or streamed to the FPGA 204 from the SSD 202).

Figure 2E:
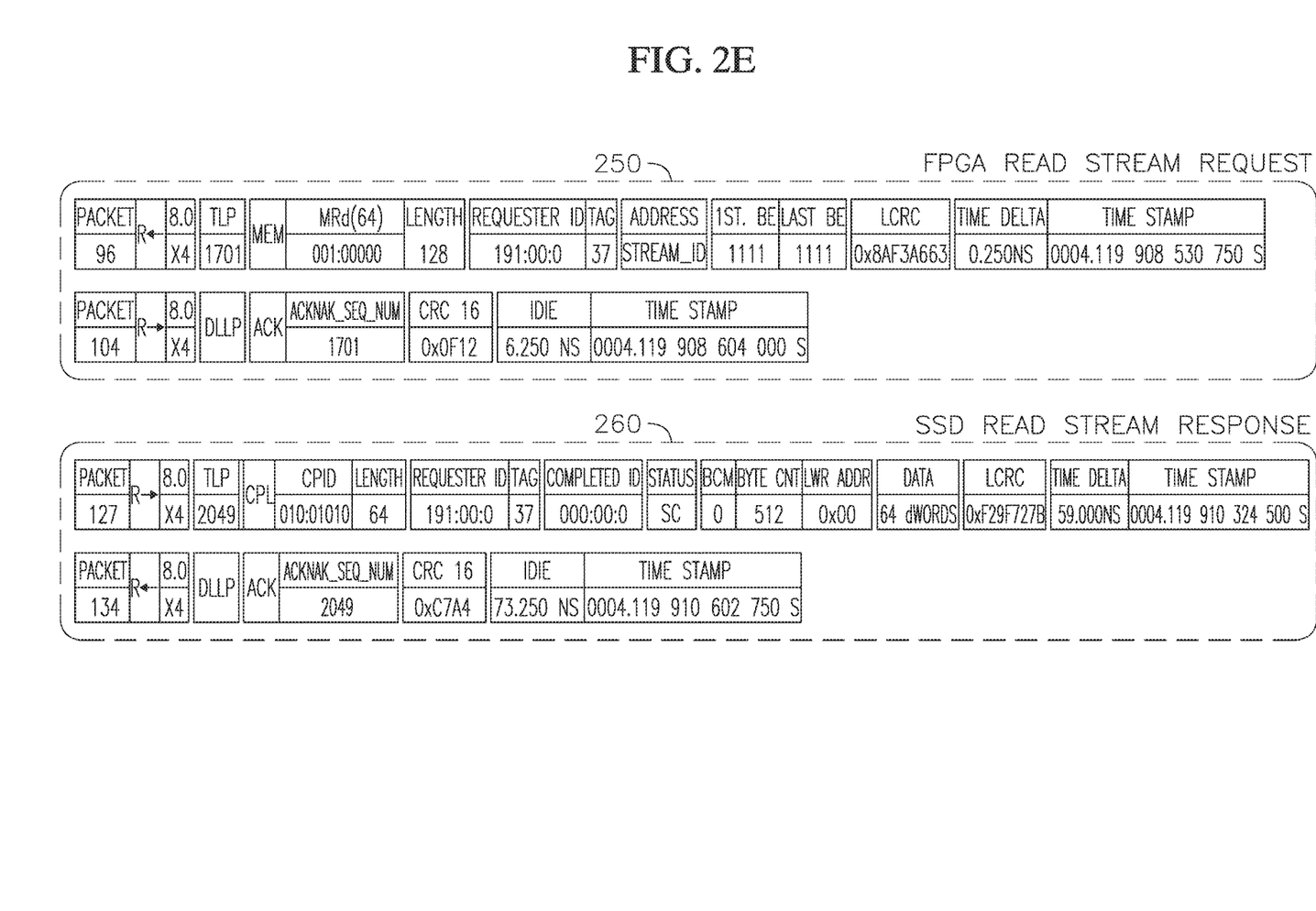
FIG. 2E illustrates an example packet sent by the secondary device with the read stream request to the storage device and an example packet sent by the storage device along the read stream response to the secondary device.

FIG. 2E illustrates an example PCI TLP packet 250 of length 128 DWORDs sent by the FPGA 204 along with the read stream request 234 to the SSD 202, as discussed with respect to FIG. 2D. FIG. 2E also illustrates an example PCI TLP packet 260 of length 64 bits sent by the SSD 202 along with the read stream response 236 to the FPGA 204, as discussed with respect to FIG. 2D.

The PCI TLP packet 250 may contain a Memory Read 64 (MRd(64)) field, a length field (e.g., length of 128 DWORDs), an address field containing the unique stream_id 203, etc. The other fields in the PCI TLP packet 250 sent to the SSD 202 may be the same as a regular or some PCI TLP packet. Therefore, in the PCI TLP packet 250 send along with the read stream request 234 to the SSD, only the stream_id 203 is specific. However, in the PCI TLP packet 250, neither the internal layout (e.g., LBA) of the SSD 202 nor the receive buffer address of the FPGA 204 is specified. In response to receiving the PCI TLP packet 250 along with the read stream request at 234, the SSD acknowledges the request and then at 236 starts the transfer of data stored in the stream buffer 214 of the SSD 202. The data stored in the stream buffer 214 of the SSD 202 corresponds to the data in the memory address of the SSD 202 corresponding to the stream_id 203. In some examples, the data transfer at 236 may be substantially similar to some PCI transfers. As such, by using the PCI TLP packet 250 format, the FPGA 204 may not require to know the LBA offsets (of the SSD 202) or require to conform to the block size restrictions of the SSD 202.

In some examples, the restrictions may arise at the protocol level on the maximum transfer size (e.g., PCI maximum packet size may be 256/512 bytes). When limited by the packet size, the read stream request or the memory read request may be broken down in the response sequence (from the SSD 202) by that transfer size. In some embodiments, FPGA 204 may request the size of data to read from the SSD 202. For example, in some embodiments, the FPGA 204 may also request (e.g., read stream request) in smaller sizes as appropriate for its stream processing size. In such a case, relatively small data chunks may be streamed from the SSD 202 to the FPGA 204 as appropriate for the FPGA's 204 stream processing size.

Returning to FIG. 2C, at successive read stream requests (e.g., 238a-238x) the FPGA 204 may read the next data chunk from the SSD 202. Each successive read (e.g., read stream requests (e.g., 238a-238x)) may contain the same address, e.g., stream_id 203, as the original read stream request 234 to make the FPGA 204 request as a streaming request to the SSD 202. All other transactions between the FPGA 204 and SSD 202, e.g., acknowledgements and completions of the read request, may follow the PCI protocol requirements.

During the successive reads, at 240, the SSD 202 can backfill data into the SSD stream buffer 214 as FPGA 204 read into its circular stream buffer 214. For example, the SSD stream buffer 214 may be replenished in the background by the SSD 202 streaming logic as and when the read stream requests are received from the FPGA 204, which may help the SSD 202 to process the read stream requests received from the FPGA 204 based on available load of the SSD. FPGA 204 reads at the speed available to the FPGA kernel and therefore, the streaming between the SSD 202 and the FPGA 204 may not affect normal IO path as the SSD 202 buffers data (e.g., data in the stream buffer 214). In the example embodiments, host device 206 is not involved in the data transfer (e.g., 234-239y) operation between the SSD 202 and the FPGA 204 by direct streaming, and the FPGA 204 and the SSD 202 directly transfer data between each other using direct streaming without exchanging data layout or buffer addresses. In some example embodiments, the SSD 202 operates in a pull model (not the push model as in some devices).

In some embodiments, the read stream requests from the FPGA 204 to the SSD 202 may continue until the original host request (e.g., configure stream command or the total length in configure read stream request 229 as discussed with respect to 228) is completed. In some embodiments, the host device 206 can queue more stream requests to the SSD 202 and continue to send streaming requests to the host and the secondary device. An example of this approach may include a video transcoding application in which the SSD 202 contains the original video file that may be transcoded to a new format and pushed out to a network stream. The final output may manage the rate at which the read stream is fetched from the SSD 202.

At 242, the SSD 202 sends an asynchronous notification of read stream complete when the original request length sent in configure stream command or the configure read stream request 229 received by the SSD 202 from the host device 206 is completed. In some embodiments, the SSD 202 may wait on the stream buffer 214 to be drained before completing the read request. In some embodiments, SSD 202 may complete the stream read request even though all data may not have been streamed. In such incomplete situations, the read stream complete notification will indicate so.

In some embodiments, the SSD 202 may determine if all the data requested by the FPGA at 234 in the read stream request or memory read request has been read by the FPGA 204 (or transferred to the FPGA 204) and based on determining that all the data requested by the FPGA at 234 in the read stream request or memory read request, has been read by the FPGA 204 (or transferred to the FPGA 204), the SSD 202 may end the direct streaming between the SSD 202 and the FPGA 204 and complete the configure stream command or the configure read stream request 229 received by the SSD 202 from the host device 206 by sending read stream complete notification back to the host device 206.

At 244, the FPGA 204 completes the start streaming request 233 received by the FPGA 204 at 232 by sending acknowledgement of completing the request 233 back to the host device 206.

In some embodiments, the completion model between the original host request (e.g., configure read stream request 229) and the SSD 202 may get complex due to the nature of the host request. Because, in some embodiments, the SSD 202 responds to the original request (e.g., configure read stream request 229) in its entirety as completed, this may be problematic for large requests which only get completed when the FPGA 204 has completed read streaming. In such a case, the host device 206 may timeout the request (e.g., configure read stream request 229) if the completion response (e.g., as discussed with respect to 242) is not received by a certain time. In order to mitigate this issue, in some embodiments the SSD 202 may complete the original request (e.g., configure read stream request 229) as soon as it receives the configure read stream request 229 and identifies the stream_id is valid and there are enough internal resources to satisfy such request. The FPGA 204 responses may be managed separately by the host device 206. In some other embodiments, the SSD may send a read stream completion of the original request at the end of the actual stream request from the FPGA 204 (e.g., as discussed with respect to 242 of FIG. 2D). In some embodiments, for the time in between and as not to let the host device 206 timeout the request, the SSD 202 may send an asynchronous notification (AEN) to show progress.

In case of direct write streaming between the FPGA 204 and the SSD 202, as part of discovery, the host device 206 may determine if the SSD 202 supports write streams. Based on the host device 206 determining that the SSD 202 supports write streams, during configuration stage (e.g., as discussed with respect to 220-226), a stream_id may be reserved for write streaming from the FPGA 204 (e.g., as discussed with respect to 220 for read stream). For data write streaming, the host device 206 may issue a stream write request with data layout details similar to 228 for the read stream. Next, the host device 206 issue the start write stream request to the FPGA 204 similar to 232 for the read stream and data transfer between the SSD 202 and the FPGA may start via direct streaming. In case of write streaming, in response to receiving the start write stream request from the host device 206, the FPGA 204 may initiate the write stream with a memory write request (e.g., a PCI TLP packet) with the write stream_id in the address field and the actual data, every time the FPGA 204 may have data to stream directly to SSD 202. Similar to the read streams, the stream_id may remain the same during the write stream operation between the FPGA 204 and the SSD 202. The SSD 202 may set the stream buffer 214 in its internal DRAM 212 and store the incoming writes and flush such data as appropriate. The completion of the write stream request received by the SSD 202 at 228 and the start streaming request received by the FPGA 204 from the host device 206 may be similar to as discussed with respect to 242 and 244 for the read streaming.

In some embodiments, the read and write streams may not be bound by the amount of data read or written at a time (by the FPGA 204) and absorbed by the SSD's 202 DRAM 212 buffer logic. However, there may be some restrictions to the granularity of the total IO read or written by the FPGA 204 to/from the SSD 202, which may be set by the minimal bytes that may be read or written to the SSD 202. This may be restricted by the block size or object/value size. To overcome such a restriction, the host device 206 may instruct the FPGA 204 to limit the granularity level of the stream requests issued to the SSD 202 by satisfying the two conditions as follows. Firstly, the total size of stream IO maybe fully divisible by the minimal block size, e.g., data should be rounded up to this value even if less, and secondly, data may be read or written in terms on the bus protocol (e.g., PCI may be byte/word/dword).

In some embodiments, in the case of read and write streaming, the reads may be satisfied back to the host (e.g., host device 206) request normally but held in the SSD's (e.g., SSD 202) buffer (e.g., stream buffer 214), until the data is requested by the FPGA (e.g., FPGA 204). Holding data in the SSD buffer (e.g., stream buffer 214) while satisfying host's (e.g., host device 206) original request may not slow down the SSD (e.g., SSD 202). The held data at the SSD buffer (e.g., stream buffer 214) may be pulled in by the FPGA (e.g., FPGA 204) when ready because it may be slower than the SSD (e.g., SSD 202). In some embodiments, the SSD (e.g., SSD 202) maintains the right to reclaim the allocated stream buffer (e.g., stream buffer 214) memory when resources are constrained.

As discussed with respect to FIGS. 2A-2E, devices that are co-located (e.g., an SSD and a FPGA co-located in a computational storage drive) or located in a same bus (e.g., an external FPGA located in the same bus as the SSD) may directly stream between each other vast amounts of data at their own pace without being bound by device limits. Furthermore, device protection features, such as, data layout and device specific features such as NVMe queues may not be utilized or required in this setup. Direct streaming between a storage device (e.g., SSD) and a secondary device (e.g., FPGA) without host intervention may also save host CPU and memory resources. Direct streaming between two devices also requires hardware level credit exchanges of their respective outstanding requests and responses as set for such request/responses in hardware. This may be applied throughout the read/write and response sequences in some embodiments. With protocol hand-holding, the direct streaming mechanism may be extended to a network fabric in order to keep the mechanism even further extensible.

FIGS. 3A-3E illustrate various usage models where the direct streaming between a storage device and a secondary device (as discussed with respect to FIGS. 2A-2E) may be useful.

Figure 3A:
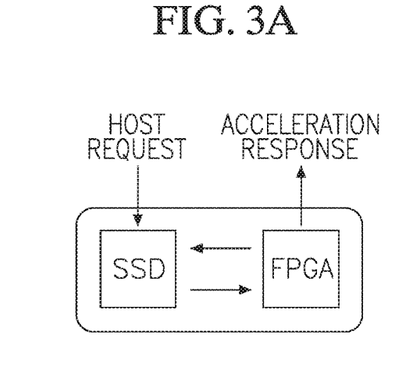
FIGS. 3A-3E illustrate various usage models in which the direct streaming between a storage device and a secondary device may be useful.
Figure 3B:
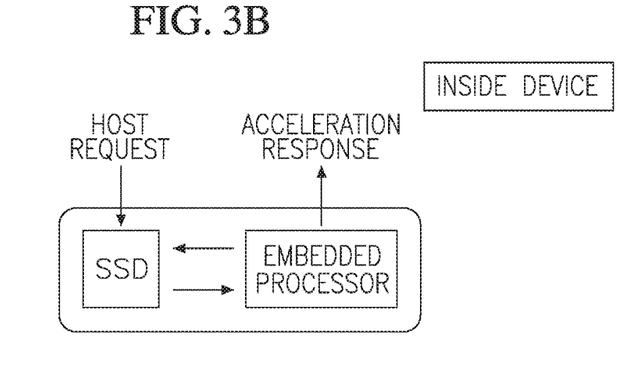
Figure 3C:
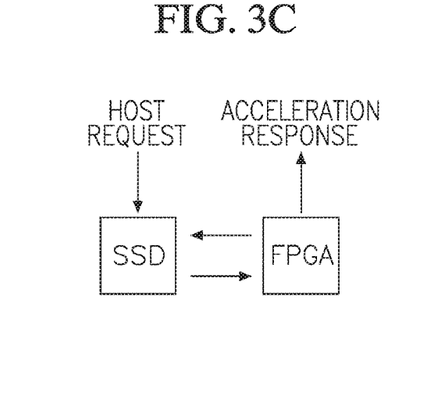
Figure 3D:
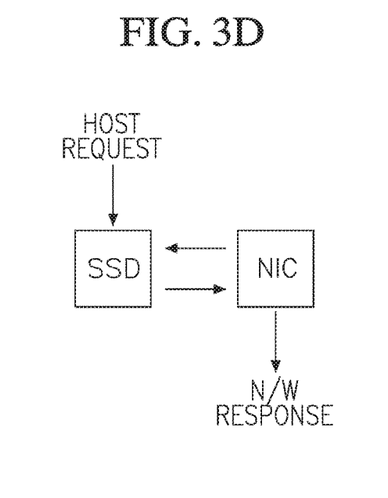
Figure 3E:
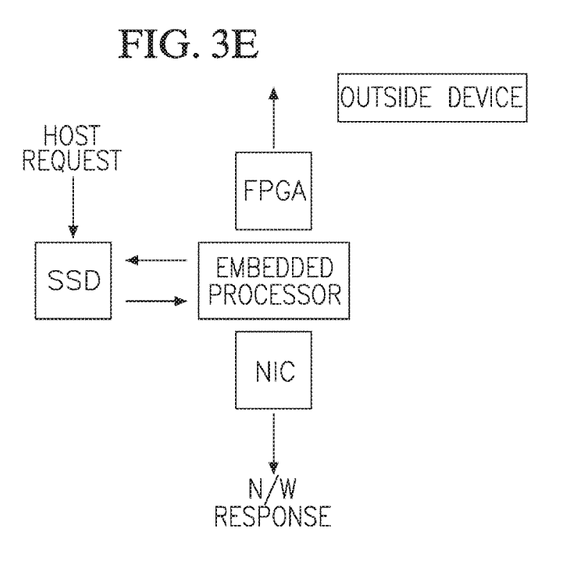

For example, FIGS. 3A-3B illustrate read and write streaming in a computational storage drive where the storage device (e.g., SSD) and the secondary device (e.g., FPGA, Embedded CPU such as Advanced RISC Machine (ARM)), RISC-V etc. are co-located (as discussed with respect to FIG. 2A-2E) in a computational storage drive. FIGS. 3C-3E illustrate read/write streaming between a storage device (e.g., SSD) and a secondary device (e.g., FPGA, ARM, NIC) located on the same bus. Computational storage drives and similar peer-to-peer (P2P) devices may benefit from having direct streaming features to stream directly from a storage device (e.g., SSD) to a secondary device (e.g., FPGA). The capability of the SSD (e.g., SSD in the computational storage drive) to stream directly to a secondary device (e.g., FPGA in the computational storage drive) may enhance data processing efficiency of the computational storage drives. In such a case, the FPGA buffer manager (e.g., FPGA buffer manager 218) may pull in (or push out) data from the SSD as required. Video transcoding, format conversions, data analytics (where large data is processed), network cards, etc., may also benefit from the direct streaming between the SSD and the FPGA.

In some example embodiments of the present disclosure, during data transfer using direct streaming (without host intervention) between a storage device (e.g., SSD) and a secondary device (e.g., FPGA) when they are co-located (e.g., a computational storage drive) or located nearby, e.g., on the same bus, the protection and data layout may still be controlled by the host while actual data movement may be directly controlled between the devices (e.g., SSD and FPGA) by communicating via a P2P connection with each other. The mechanism further shows that device specific details such as LBA, blocks, and destination memory address on the SSD and destination address on the secondary device (e.g., FPGA) side are not exposed, which may help bind the protections between the devices.

In some embodiments, the NVMe commands can be posted to SQ and the NVMe device (e.g., NVMe SSD) pulls commands from SQ when ready, the NVMe device pushes read data to stream buffer when ready, the NVMe device waits for stream buffer to drain (pull model), the NVMe device pushes completion entry to CQ, and the NVMe device pushes interrupt to host CPU.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for streaming storage device content have been specifically described and illustrated herein, many modifications and variations will be apparent to those skilled in the art. Accordingly, it is to be understood that a system and method for streaming storage device content constructed according to principles of this invention may be embodied other than as specifically described herein. The invention is also defined in the following claims, and equivalents thereof.

What is claimed is:

1. A method of streaming between a storage device and a secondary device, the method comprising:
    receiving, by the storage device, from the secondary device, a memory read request command comprising a memory address of the storage device corresponding to a stream identity, the stream identity being unique between the storage device and the secondary device;
    in response to receiving, by the storage device, the memory read request command corresponding to the stream identity that is unique between the storage device and the secondary device, streaming, by the storage device, data between the storage device and the secondary device by transferring the data corresponding to the memory address of the storage device corresponding to the stream identity that is unique between the storage device and the secondary device, to the secondary device;
    determining, by the storage device, that the data requested by the secondary device in the memory read request command is transferred to the secondary device; and
    ending, by the storage device, the streaming between the storage device and the secondary device.

2. The method of claim 1, wherein the storage device is a solid state drive (SSD) and the secondary device is a field programmable gate array (FPGA).

3. The method of claim 2, wherein the SSD and the FPGA are located on same bus.

4. The method of claim 2, wherein the SSD and the FPGA are co-located in a computational storage drive.

5. The method of claim 1, wherein the streaming between the storage device and the secondary device further comprises streaming, by the storage device to the secondary device, data stored in a stream buffer of the storage device, wherein the secondary device is an embedded processor or a network interface controller (NIC), the embedded processor being an Advanced RISC Machine (ARM)) processor or a RISC-V processor.

6. The method of claim 5 wherein, the data stored in the stream buffer being the data in the memory address of the storage device corresponding to the stream identity.

7. The method of claim 6, further comprising the storage device filling the stream buffer until the data requested by the secondary device in the memory read request command is streamed to the secondary device from the storage device.

8. The method of claim 1, further comprising:
    receiving, by the storage device, a command from a host device connected to the storage device, to reserve the stream identity for a data stream for the streaming of data between the storage device and the secondary device;
    sending, by the storage device, the stream identity to the host device; and
    registering, by the host device, in response to receiving the stream identity from the storage device, the stream identity with the secondary device connected to the host device and the storage device.

9. The method of claim 8, further comprising:
    receiving, by the storage device, a read stream request command from the host device; and
    receiving, by the secondary device, from the host device, a request command to start streaming between the storage device and the secondary device.

10. The method of claim 9, wherein the read stream request command from the host device comprising the stream identity, a logical block address (LBA) offset, and number of blocks to read by the secondary device from the storage device.

11. The method of claim 10, wherein in response to receiving the read stream request command, a controller in the storage device is configured to place data in a stream buffer of the storage device, wherein the data placed in the stream buffer comprises the data requested by the read stream request command.

12. The method of claim 9 further comprising:
    sending, by the storage device to the host device, an acknowledgement that the read stream request command from the host device is completed by the storage device; and
    sending, by the secondary device to the host device, an acknowledgement that the request command to start streaming between the storage device and the secondary device from the host device is completed by the secondary device.

13. A method comprising:
    receiving, by a secondary device, from a host device connected to the secondary device, a request command to start streaming between a storage device and the secondary device, the storage device being connected to the secondary device and the host device;
    sending, by the secondary device to the storage device, a memory read request command comprising a memory address of the storage device corresponding to a stream identity, the stream identity being unique between the storage device and the secondary device; and
    in response to sending the memory read request command corresponding to the stream identity that is unique between the storage device and the secondary device, receiving, by the secondary device from the storage device via streaming, data corresponding to the memory address of the storage device corresponding to the stream identity that is unique between the storage device and the secondary device, to the secondary device,
    wherein in response to the data requested by the secondary device in the memory read request command being transferred to the secondary device, the storage device is configured to end the streaming between the secondary device and the storage device.

14. The method of claim 13, wherein the storage device is a solid state drive (SSD) and the secondary device is a field programmable gate array (FPGA), the SSD and the FPGA being located on same bus or being co-located in a computational storage drive.

15. The method of claim 13, wherein, the streaming further comprises, receiving, by the secondary device from the storage device, data stored in a stream buffer of the storage device, the data stored in the stream buffer being the data in the memory address of the storage device corresponding to the stream identity, wherein the storage device is configured to fill the stream buffer until the data requested by the secondary device in the memory read request command is streamed to the secondary device from the storage device.

16. The method of claim 13, further comprising:
registering, at the secondary device by the host device, the stream identity received from the storage device; and
sending, by the secondary device to the host device, an acknowledgement that the request command to start streaming between the storage device and the secondary device from the host device is completed by the secondary device.

17. A method of streaming between a storage device and a secondary device, the method comprising:
receiving, by the storage device, a command from a host device connected to the storage device to reserve a stream identity for a data stream for streaming of data between the storage device and the secondary device, the stream identity being unique between the storage device and the secondary device;
registering, by the host device, in response to receiving the stream identity that is unique between the storage device and the secondary device, from the storage device, the stream identity with the secondary device connected to the host device and the storage device;
receiving, by the storage device, a read stream request command from the host device;
receiving, by the secondary device, from the host device, a request command to start streaming between the storage device and the secondary device;
receiving, by the storage device, from the secondary device, a memory read request command comprising a memory address of the storage device corresponding to the stream identity that is unique between the storage device and the secondary device; and
in response to receiving by the storage device the memory read request command corresponding to the stream identity that is unique between the storage device and the secondary device, streaming, by the storage device, data between the storage device and the secondary device, by transferring the data corresponding to the memory address of the storage device corresponding to the stream identity that is unique between the storage device and the secondary device, to the secondary device.

18. The method of claim 17, further comprising:
determining, by the storage device, that the data requested by the secondary device in the memory read request command is transferred to the secondary device;
ending, by the storage device, the streaming between the storage device and the secondary device;
sending, by the storage device to the host device, an acknowledgement that the read stream request command from the host device is completed by the storage device; and
sending, by the secondary device to the host device, an acknowledgement that the request command to start streaming between the storage device and the secondary device from the host device is completed by the secondary device.

19. The method of claim 17, wherein the storage device is a solid state drive (SSD) and the secondary device is a field programmable gate array (FPGA), the SSD and the FPGA being located on same bus or being co-located in a computational storage drive.

20. The method of claim 17, wherein the read stream request command from the host device comprising the stream identity, a logical block address (LBA) offset, and number of blocks to read by the secondary device from the storage device, wherein in response to receiving the read stream request command, a controller in the storage device is configured to place data in a stream buffer of the storage device, wherein the data placed in the stream buffer comprises the data requested by the read stream request command, and wherein the stream identity is unique between the storage device and the secondary device.

21. A system comprising:
a storage device;
a secondary device connected to the storage device; and
a host device connected to the storage device and the secondary device, wherein:
the storage device is configured to receive a command from the host device to reserve a stream identity for a data stream for streaming of data between the storage device and the secondary device, the stream identity being unique between the storage device and the secondary device;
the host device is configured to register the stream identity that is unique between the storage device and the secondary device with the secondary device;
the storage device is further configured to receive a read stream request command from the host device;
the secondary device is configured to receive a request command to start streaming between the storage device and the secondary device from the host device,
in response to the secondary device receiving the request command to start streaming between the storage device and the secondary device from the host device, the storage device is configured to:
receive, a memory read request command comprising a memory address of the storage device corresponding to the stream identity that is unique between the storage device and the secondary device, from the secondary device; and
in response to receiving the memory read request command corresponding to the stream identity that is unique between the storage device and the secondary device, stream data between the storage device and the secondary device by transferring the data corresponding to the memory address of the storage device to the secondary device.

* * * * *